United States Patent
Ohmoto et al.

(10) Patent No.: US 9,320,156 B2
(45) Date of Patent: Apr. 19, 2016

(54) MOUNTING STRUCTURE FOR CASING OF OCCUPANT PROTECTION DEVICE CONTROL UNIT

(71) Applicant: HONDA MOTOR CO., LTD., Tokyo (JP)

(72) Inventors: Takahiro Ohmoto, Wako (JP); Kenyu Okamura, Wako (JP); Takahiro Ishikawa, Wako (JP); Shinya Ueki, Wako (JP); Tomoya Yoshikawa, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 14/291,058

(22) Filed: May 30, 2014

(65) Prior Publication Data
US 2014/0353457 A1  Dec. 4, 2014

(30) Foreign Application Priority Data
May 31, 2013  (JP) ................................. 2013-116234

(51) Int. Cl.
*H05K 5/02* (2006.01)
*H05K 5/00* (2006.01)
*B60R 21/01* (2006.01)

(52) U.S. Cl.
CPC .............. *H05K 5/0078* (2013.01); *B60R 21/01* (2013.01); *H05K 5/0073* (2013.01)

(58) Field of Classification Search
CPC .. H05K 5/0073; H05K 5/0078; H05K 5/0082
USPC ............................ 280/735; 248/548; 174/58
See application file for complete search history.

(56) References Cited

U.S. PATENT DOCUMENTS

| | | | |
|---|---|---|---|
| 6,728,110 B2 | 4/2004 | Koyama | |
| 6,765,146 B1 * | 7/2004 | Gerardo | ........................ 174/58 |
| 8,096,576 B2 | 1/2012 | Azuma | |
| 8,414,013 B2 * | 4/2013 | Koyama | ....................... 280/727 |
| 2005/0056447 A1 * | 3/2005 | Nakamura et al. | ............. 174/58 |
| 2005/0067180 A1 * | 3/2005 | Dinh | ............................... 174/58 |
| 2010/0253188 A1 * | 10/2010 | Koyama | .................... 312/223.1 |
| 2011/0085307 A1 * | 4/2011 | Burgi et al. | .................. 361/752 |

FOREIGN PATENT DOCUMENTS

| | | |
|---|---|---|
| JP | 2002-308021 A | 10/2002 |
| JP | 2010-83382 A | 4/2010 |
| JP | 2010-215127 A | 9/2010 |

\* cited by examiner

*Primary Examiner* — Michael Safavi
(74) *Attorney, Agent, or Firm* — Westerman, Hattori, Daniels & Adrian, LLP

(57) ABSTRACT

A casing for housing an occupant protection device unit is composed of a metallic base with its plate surfaces facing upward and downward, respectively, and a main body that is put on and mounted on the surface of the base. A bracket formed integrally with the base is composed of a plate-like leg extending laterally from the edge in the base and a fastening member that is integrally formed at an end of the leg and is bolted to the vehicle body. The leg is composed of a through-hole vertically passing therethrough and the two weak portions. The two weak portions are composed of two branching portions separated by the through-hole in the leg. If an excessive collision load is exerted on the bracket from the vehicle body, the two weak portions are torn off, thereby allowing the occupant protection control unit to be protected.

7 Claims, 11 Drawing Sheets

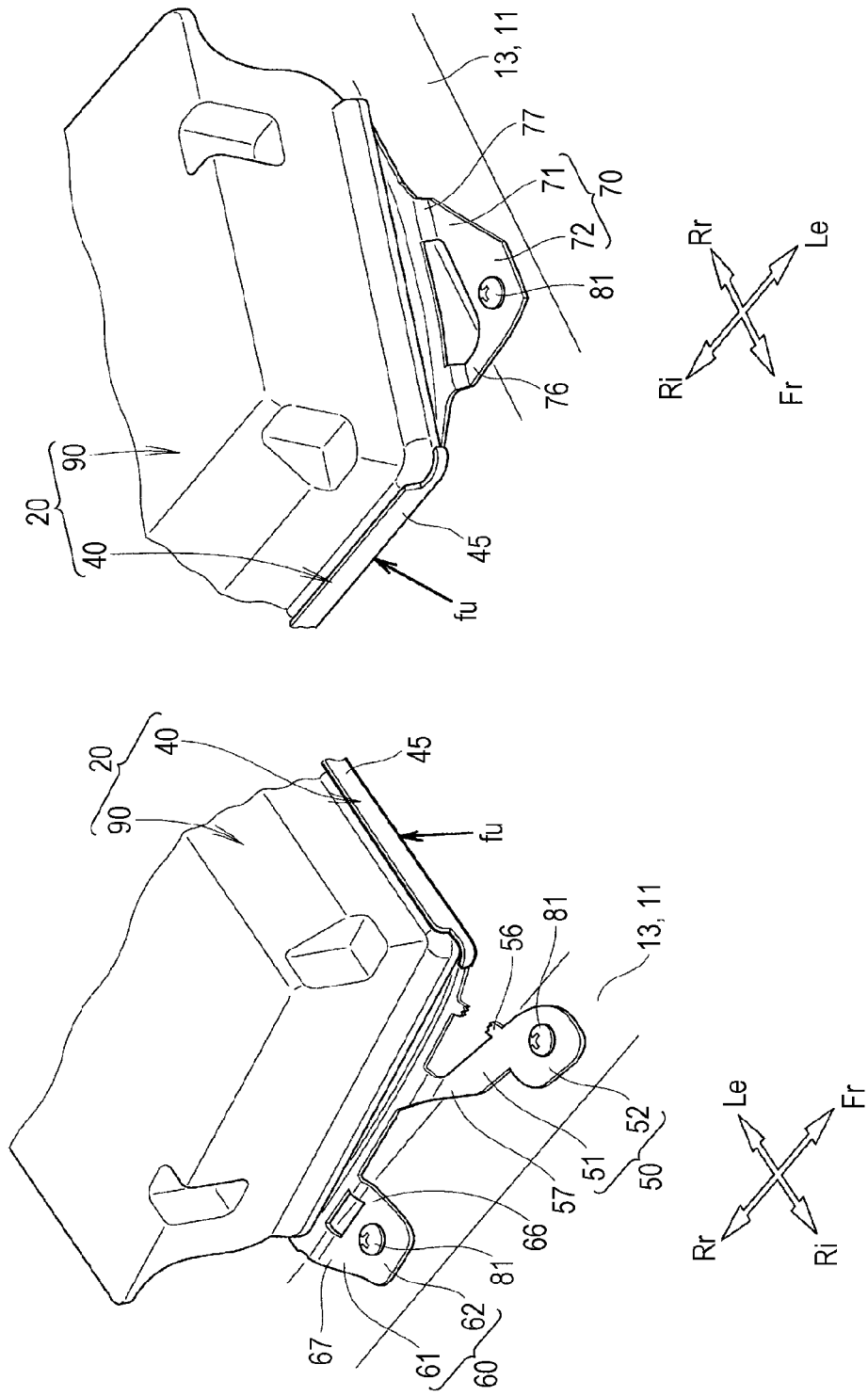

MOUNTING STRUCTURE FOR CASING OF OCCUPANT PROTECTION DEVICE CONTROL UNIT

CROSS REFERENCES TO RELATED APPLICATIONS

The present application claims priority under 35 U.S.C. §119 to Japanese Patent Application No. 2013-116234, filed May 31, 2013, entitled "Mounting Structure for Casing of Occupant Protection Device Control Unit." The contents of this application are incorporated herein by reference in their entirety.

TECHNICAL FIELD

The present disclosure relates to an improved technique for a casing mounting structure that, when an excessive collision load is exerted on a casing for housing an occupant protection device control unit, can protect the occupant protection device control unit by causing the mounts of the casing to be torn off.

BACKGROUND

An occupant protection system installed in a vehicle uses an acceleration sensor to detect that the vehicle has been subjected to a collision load from a vehicle front and cause an occupant protection device control unit to control the occupant protection system in accordance with a detection signal from the acceleration sensor. The occupant protection device control unit is a unit that is housed in a casing and installed in the front section of the vehicle body. Some of occupant protection device control units have an acceleration unit integrated thereinto, which are called a sensor integrated type. Integration of sensors allows the simplification of, for example, a signal system of the occupant protection system. Such a casing that houses an occupant protection device control unit is known by, for example, Japanese Unexamined Patent Application Publication Nos. 2002-308021 and 2010-083382.

The casing for an occupant protection device control unit known by Japanese Unexamined Patent Application Publication No. 2002-308021 is composed of a main body made of aluminum die-cast having its bottom surface opened and a cover made of a steel plate that covers the bottom surface of the main body. A substrate for the occupant protection device control unit is secured to the main body with screws, together with the cover located below the substrate. The main body has a mounting bracket formed thereon. The mounting bracket has a weak portion. The weak portion is formed by thinning a base end of the main body which provides a connection between the main body and the mounting bracket. Alternatively, the weak portion is formed by making a through-hole in the main body close to a base end of the mounting bracket.

The casing for an occupant protection device control unit known by Japanese Unexamined Patent Application Publication No. 2010-083382 is composed of a resin-made main body having its bottom surface opened and a cover that covers the bottom surface of the main body. A substrate for the occupant protection device control unit is secured to the main body with screws, together with the cover located below the substrate. The main body has a mounting bracket formed thereon. The mounting bracket has a weak portion. The weak portion is formed by making a bundle in the mounting bracket.

For casings disclosed in Japanese Unexamined Patent Application Publication Nos. 2002-308021 and 2010-083382, a collision load to which a vehicle body is subjected is transmitted to the main body through the mounting bracket and to the substrate through screws and then to an acceleration sensor installed on the substrate. In addition, if an excessive collision load is exerted on the bracket through the vehicle body, the weak portion is torn off, thereby protecting an occupant protection device control unit inside the casing.

It is preferable that the collision load is transmitted from the vehicle body to the acceleration sensor as directly as possible without the main body in a transmission path in order to allow the collision load to be transmitted to the acceleration sensor more quickly, exactly. To that end, it is conceivable that the cover is changed to a base made of a steel plate or other metallic plate, and that a bracket is attached to such a base and mounted on the vehicle body. Such a casing for housing an occupant protection device control unit is known by Japanese Unexamined Patent Application Publication No. 2010-215127.

The casing for housing an occupant protection device control unit known by Japanese Unexamined Patent Application Publication No. 2010-215127 is composed of a main body made of aluminum die-cast or resin having its bottom surface opened and a base made of a metallic plate that covers the bottom surface of the main body. A substrate for the occupant protection device control unit is secured to the main body with screws, together with the base located below the substrate. The base has an integral mounting bracket formed thereon. The main body has an independent mounting bracket fixed thereto in a fragile manner. In other words, such an independent bracket is a member separate from the main body.

For a casing disclosed in Japanese Unexamined Patent Application Publication No. 2010-215127, a collision load to which a vehicle body is subjected is transmitted from the vehicle body to the base through the integral bracket and to the substrate through screws and then to an acceleration sensor installed on the substrate. In addition, if an excessive collision load is exerted on the bracket through the vehicle body, the independent bracket is torn off from the main body, thereby protecting an occupant protection device control unit inside the casing.

However, the casing disclosed in Japanese Unexamined Patent Application Publication No. 2010-215127 needs many components since the independent bracket is fabricated using members separate from the main body, resulting in an increase in cost.

The inventors found the followings. To avoid such a cost increase, it is conceivable that the bracket is formed only on the base made of a metallic plate in an integral manner, namely, an integral bracket is formed. If such an integral bracket is used, a weak portion may be provided on the integral bracket.

However, a base or an integral bracket made of, for example, a steel plate, has a relatively large ductility. For this reason, for a weak portion just provided on such an integral bracket, there is a limit on setting a lower level of breaking load for breaking the weak portion. In order to improve the protection of the occupant protection device control unit housed in the casing against a collision load, the weak portion must break quickly and reliably without plastic deformation before the weak portion receives a large breaking load.

SUMMARY

For a casing which is composed of a base installed in a vehicle body and a main body that is put on and mounted on the surface of the base, the present application describes a technique for enhancing the performance for protecting an occupant protection device control unit housed in the casing from a collision load.

According to a first aspect of the embodiment, a mounting structure for casing of an occupant protection device control unit is provided which includes a casing for housing the occupant protection device control unit, a bracket for mounting the casing on a vehicle body, and at least one weak portion provided on the bracket, the weak portion breaking and thereby protecting the occupant protection device control unit housed in the casing if an excessive collision load is exerted on the bracket from the vehicle body, wherein the casing is composed of a base made of a metallic plate with its surfaces facing upward and downward, respectively, and a main body that is put on and mounted on a surface of the base, wherein the base has the bracket formed therein in an integral manner, wherein the bracket is composed of a plate-like leg portion extending laterally from the edge of the base and a fastening portion that is integrally formed at an end of the leg portion and is bolted to the vehicle body, wherein the leg portion is composed of a through-hole vertically passing therethrough and the two weak portions, and wherein the two weak portions are composed of two branching portions separated by the through-hole in the leg portion. If an excessive collision load is exerted on the bracket from the vehicle body, the collision load is dispersed in the fastening portion to the two weak portions in the leg portion. The weak portions may be configured to have breaking strength to break when subjected to the dispersed, smaller levels of load. The weak portions can be torn off separately by relatively smaller levels of load. The bracket is torn off quickly and reliably in response to the excessive collision load. In other words, the bracket can be controlled so as to avoid continued plastic deformation without tearing off. This enhances the performance for protecting the occupant protection device control unit in the casing from the collision load. The occupant protection device control unit has various important data stored therein. Such enhanced protection of the occupant protection device control unit ensures that the various data are read out from the occupant protection device control unit. In addition, the two weak portions may be composed of only the branching portions separated by the through-hole in the leg, resulting in a reduction in manufacturing cost of the casing.

According to a second aspect of the embodiment, one of the two weak portions is preferably weaker than the other. With this arrangement, the two weak portions are torn off at different timings, thereby allowing the bracket to be torn off more quickly and reliably in response to an excessive collision load.

According to a third aspect of the embodiment, the two weak portions are preferably formed in a vertically-arranged step-like manner in the leg portion. With this arrangement, the weak portions, when torn off, are prevented from interfering with each other at edges thereof, thereby ensuring that the weak portions are more properly torn off.

BRIEF DESCRIPTION OF THE DRAWINGS

The advantages of the disclosure will become apparent in the following description taken in conjunction with the following drawings.

FIGS. 8A and 8B are explanatory drawings illustrating a state where part of a vehicle body comes into contact with a casing shown in FIG. 2 from lower front of a vehicle.

DETAILED DESCRIPTION

An embodiment according to the present disclosure is described below with reference to the attached drawings.

A casing for housing an occupant protection device control unit according to an embodiment of the present disclosure is described below with reference to the attached drawings. Reference to "front", "rear", "left", "right", "top" or "bottom" side of the vehicle is relative to an operator's position in a driver's seat, while "Fr", "Rr", "Le", and "Ri" refer to a vehicle front, rear, left, and right side, respectively.

Figure 1:
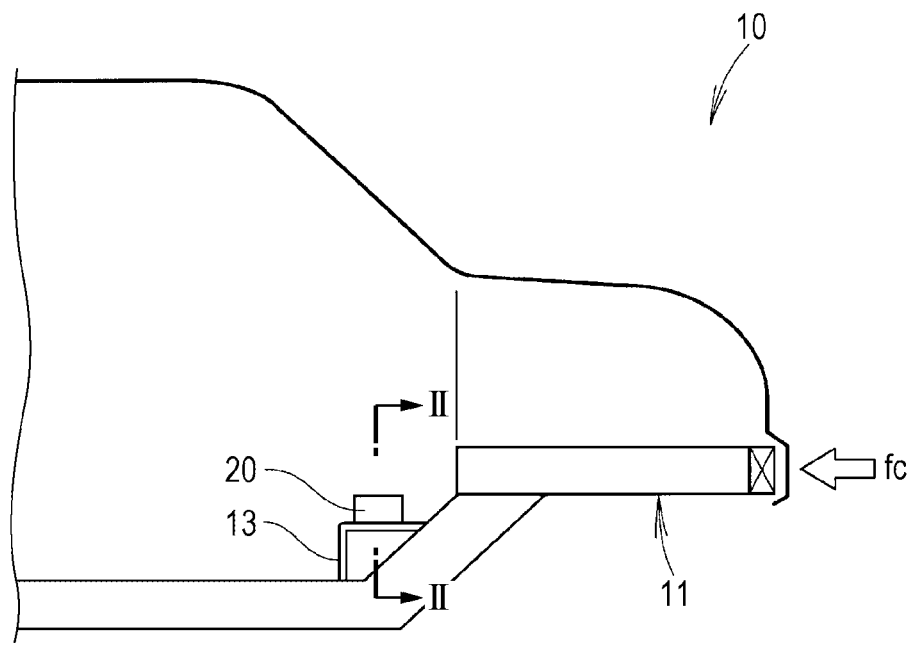
FIG. 1 is a schematic side view, showing a front section of a vehicle provided with a casing for housing an occupant protection device control unit according to an embodiment of the present disclosure.
Figure 2:
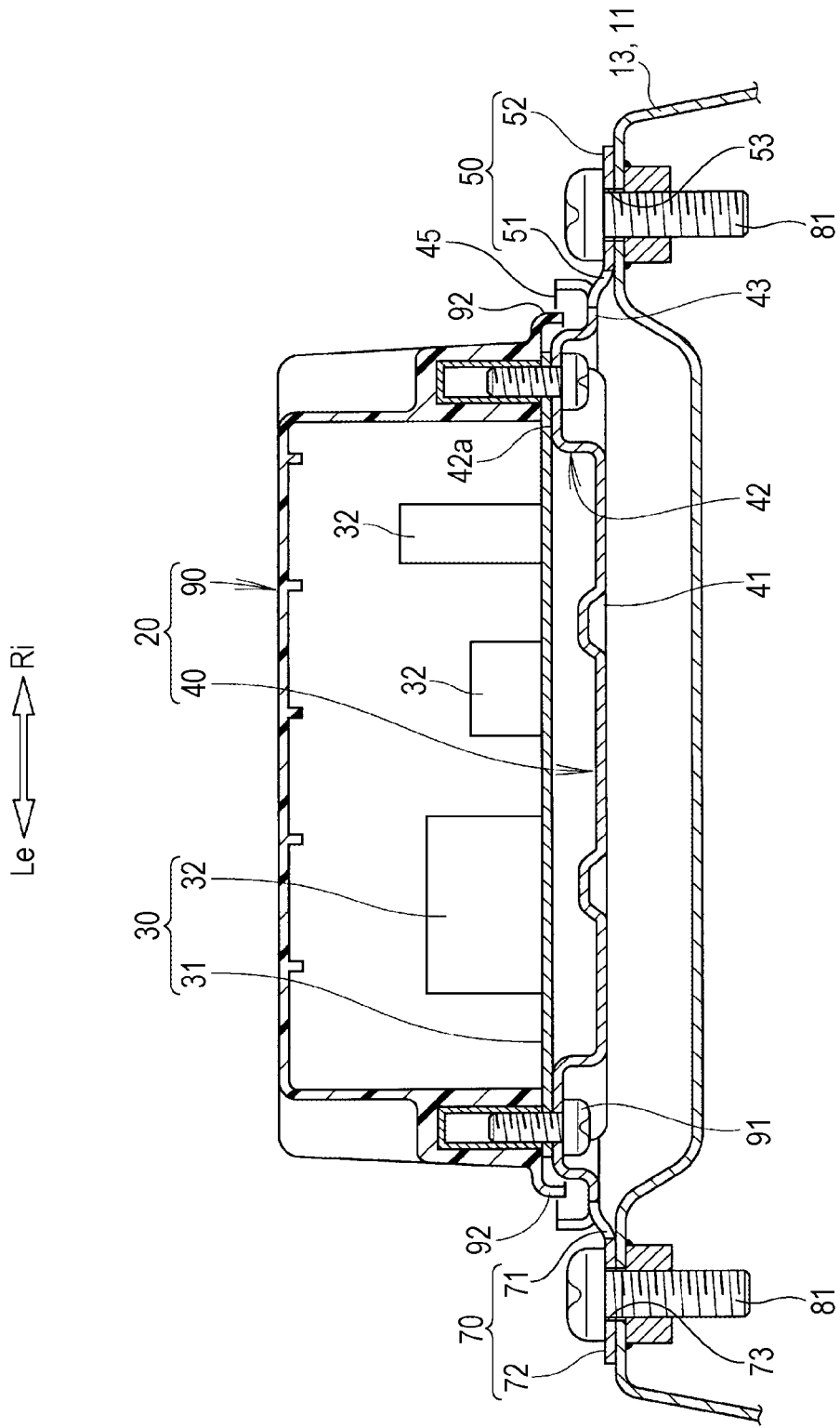
FIG. 2 is a sectional view taken along line II-II of FIG. 1.

As shown in FIG. 1, a vehicle body 11 of a vehicle 10 such as a motor vehicle has a casing mounting bracket 13 provided at a front portion thereof or, for example, a front end of a floor tunnel thereof. The front portion of the vehicle body 11, namely, the casing mounting bracket 13 has a casing 20 provided thereon. A front portion of the casing 20 is directed toward the front of the vehicle 10. As shown in FIG. 2, the casing 20 is a casing in which an occupant protection device control unit 30 or electronic components 32 is housed.

The occupant protection device control unit 30 is composed of a substrate 31 such as a printed circuit board and the electronic components 32 mounted on the substrate 31. The occupant protection device control unit 30 is a unit that controls an occupant protection system when the vehicle 10 is subjected to a collision load, including an acceleration sensor for detecting that the vehicle has received the collision load. In other words, the acceleration sensor is included as a part of the electronic components 32.

The casing 20 is composed of a metallic base 40 mounted on the vehicle body with its plate surfaces facing upward and downward, respectively, and a resin-made main body 90 of the casing 20 that is put on and mounted on the upper side (plate surface) of the base 40. The base 40 is a folding molded component made of, for example, light alloy, such as aluminum alloy, or steel plate that is substantially rectangular, when viewed in a plane, and substantially plate-like.

Figure 3:
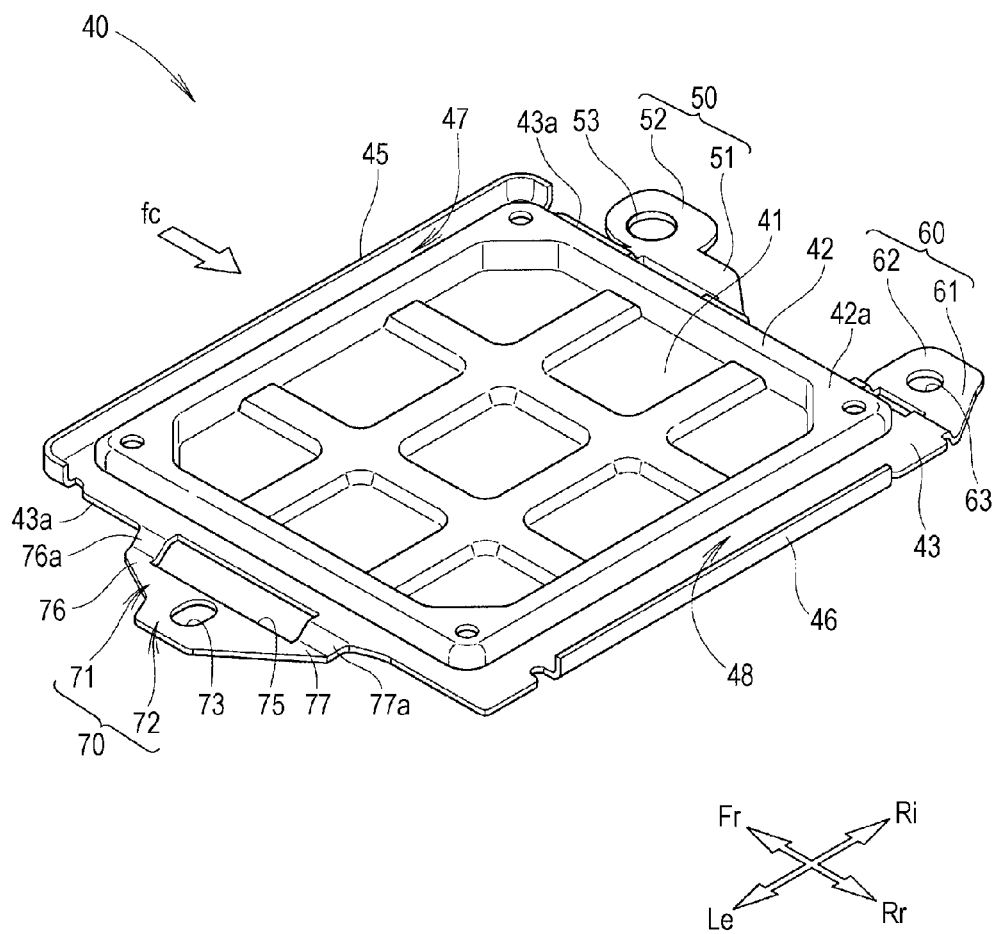
FIG. 3 is a perspective view of a base shown in FIG. 2.

More specifically, the base 40, as shown in FIGS. 2 and 3, is an integral molding consisting of a flat center section 41 that is substantially rectangular in plan view, a frame section 42 that surrounds the center section 41, and a flat edge section 43 that surrounds the frame section 42. The frame section 42 protrudes upward from an edge of the center section 41 and has its upper end surface 42a formed to have a flat surface. The upper end surface 42a is parallel to the center section 41.

Figure 4:
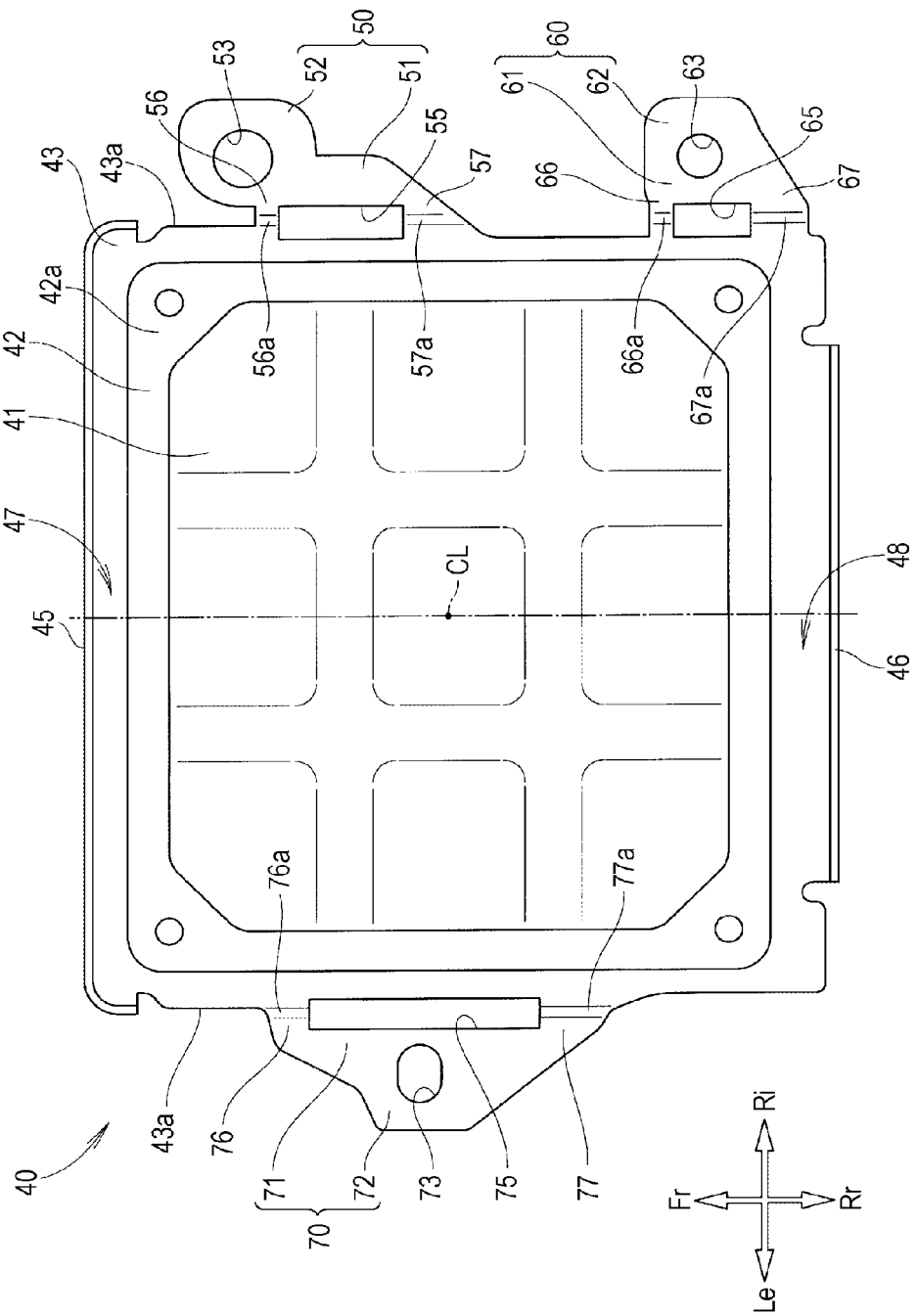
FIG. 4 is a plan view of a base shown in FIG. 3.

The edge section 43 is formed to be parallel to and be leveled with the center section 41. As shown in FIG. 4, right and left side end surfaces 43a, 43a in the edge section 43 is parallel to a straight line CL (widthwise center line) extending toward the longitudinal direction of the casing through a widthwise center of the base 40.

As shown in FIGS. 2 through 4, the edge section 43 has a vertical plate-like front wall 45 formed at a front end surface thereof, namely, a surface facing a front of the vehicle 10, which extends upward from the entire extent of the front end surface. Also, the edge section 43 has a vertical plate-like rear wall 46 formed at a rear end surface thereof, which extends upward from the entire extent of the rear end surface. A front groove 47 is provided between a front end of the frame section 42 and the front wall 45. Also, a rear groove 48 is provided between a rear end of the frame section 42 and the rear wall 46. The front wall 45 and the rear wall 46 are leveled with an upper end surface 42a of the frame section 42.

The casing 20 has a plurality of brackets 50-70 for its installation to the vehicle body 11. More specifically, as shown in FIGS. 3 and 4, the brackets 50-70 extend from right and left edges 43a, 43a in the base 40, namely, the right and left side end surfaces 43a, 43a in the edge section 43 toward the lateral direction (laterally outward) and are formed integrally with the base 40. The plurality of brackets 50-70 (for example, three brackets) include a first bracket 50 located at the right front portion of the edge 43 in the base 40, a second bracket 60 located at the right rear portion of the edge 43 in the base 40, and a third bracket 70 located at the left center of the edge 43a in the base 40, each of which is secured to the vehicle body 11 with bolts 81 (including a screw).

Figure 5A:
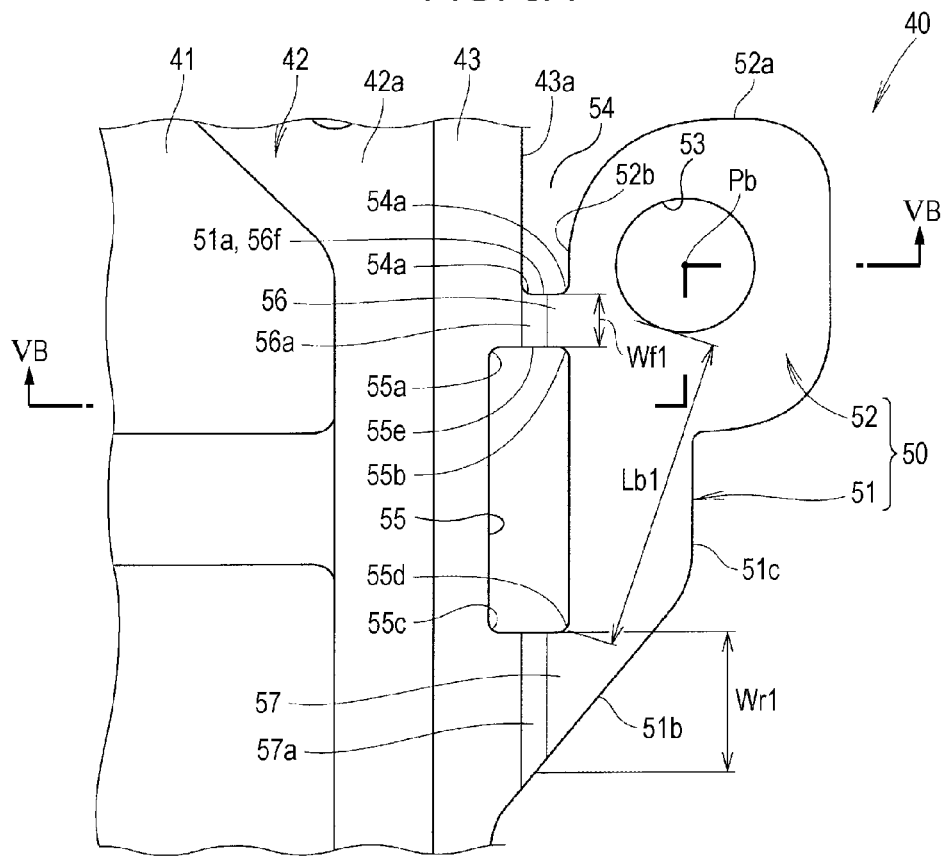
FIGS. 5A and 5B are enlarged views of a first bracket shown in FIG. 4.
Figure 5B:
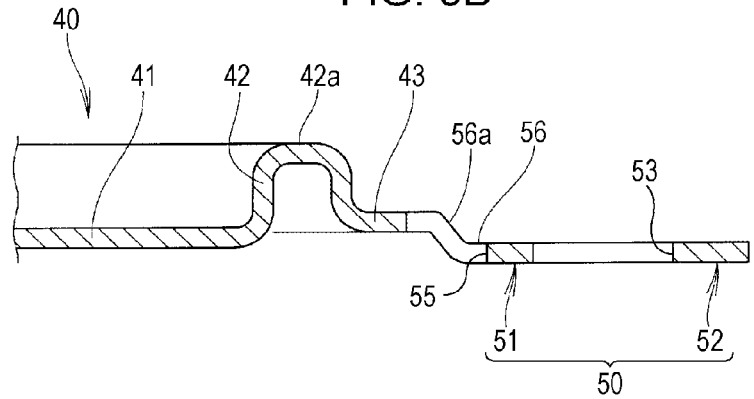

FIG. 5A is an enlarged view of a first bracket 50 shown in FIG. 4. FIG. 5B is a sectional view taken along line VB-VB of FIG. 5A. The first bracket 50 is composed of a plate-like leg 51 extending laterally from the edge 43a (side end surface 43a in the edge section 43) in the base 40 and a fastening member 52 that is integrally formed at an end of the leg 51 and is bolted to the vehicle body 11 (see FIG. 1).

A front end surface 51a (surface 51a facing a vehicle front) in the leg 51 is perpendicular to the side end surface 43a in the edge section 43 and is formed to linearly extend right sideways from the side end surface 43a. A rear end surface 51b in the leg 51 is formed to extend obliquely forward in relation to the side end surface 43a in the edge section 43. A side end surface 51c in the leg 51 is formed to linearly extend forward from an end of the rear end surface 51b.

The fastening member 52 has a circular bolt hole 53 formed therein, which vertically passes therethrough. In addition, the fastening member 52 is located at a front outer corner of the leg 51. This arrangement causes a front end surface 52a of the fastening member 52 to be located in front of the front end surface 51a of the leg 51. As a result, a recess 54 (notch 54) is formed in front of the leg 51, which is surrounded by the side end surface 43a of the edge section 43, the front end surface 51a of the leg 51, and an inner side surface 52b of the fastening member 52. The recess 54 is opened forward and has its both rear corners formed into a square shape (including a substantial square shape), in plan view. This configuration causes stress to tend to concentrate on and tear off the both rear corners 54a, 54a of the recess 54. In other words, notch effect tends to act on the rear corners.

The leg 51 is composed of a through-hole 55 vertically passing therethrough, and front and rear branching portions 56, 57 separated by the through-hole 55. The through-hole 55 is located on the side end surface 43a of the edge section 43 and is formed into a rectangular shape that is elongated to extend in the longitudinal direction and is parallel to the widthwise center line CL (see FIG. 4). Four corners 55a-55d of the through-hole 55, namely, an inner front corner 55a, an outer front corner 55b, a inner rear corner 55c, and a outer rear corner 55d are formed into a square (including a substantial square), in plan view.

The two branching portions 56, 57 (bifurcated portions) longitudinally separated from each other by the through-hole 55 in the leg 51 extend sideways from the edge 43a in the base 40, thereby constituting two weak portions 56, 57. The two branching portions 56, 57 are hereinafter referred to as "two weak portions 56, 57". The front branching portion 56 constitutes the front weak portion 56, while the rear branching portion 57 constitutes the rear weak portion 57.

The front weak portion 56 (one weak portion 56) of the two weak portions 56, 57 is weaker than the rear weak portion 57 (the other weak portion 57).

More specifically, the width Wf1 of the front weak portion 56 or length Wf1 from the front end surface 51a of the leg 51 (a front end surface 56f of the front weak portion 56) to a front edge 55e of the through-hole 55 is smaller than the width Wr1 of the rear weak portion 57. The front end surface 51a of the leg 51 is located slightly behind the center Pb of the bolt hole 53 in the fastening member 52. In addition, the recess 54 is formed just in front of the front end surface 51a of the leg 51. This arrangement allows the generation of a local distortion at the front weak portion 56 when the leg 51 receives a collision load and deforms vertically or longitudinally, thereby ensuring that the front weak portion 56 is torn off.

On the other hand, length Lb1 from the outer rear corner 55d of the four corners 55a-55d in the through-hole 55 to an edge of the bolt hole 53 is configured to be larger. With this arrangement, when the leg 51 receives a collision load and deforms vertically or longitudinally, the rear weak portion 57 has a greater amount of deformation in response to the load, or the rear weak portion 57 has a smaller spring rate. In other words, the magnitude of the load relative to the deformation amount of the rear weak portion 57 can be reduced.

As described above, when the base 40 is subjected to a vertical or longitudinal load, the front weak portion 56 is weaker than the rear weak portion 57. When the leg 51 is deformed, this arrangement allows the front weak portion 56 to be torn off first, thereby allowing the entire deformation force on the leg 51 to be reduced. In other words, the first weak portion 56 can be torn off as the first step of the deformation of the leg 51.

The rear end surface 51b of the leg 51 is configured to be slanted to the square outer rear corner 55d of the four corners 55a-55d in the through-hole 55. This arrangement helps cause the notch effect to act on the square outer rear corner 55d or a corner 55d.

The two weak portions 56, 57 are formed in a vertically-arranged step-like manner in the leg 51. In other words, the weak portions 56, 57 have slopes 56a, 57a formed therein, respectively, which descend from a base end closer to the edge 43a of the base 40 to a distal end thereof. The weak portions 56, 57 have the distal end located lower than the base end (at the edge 43a of the base 40). The fastening member 52 is leveled with the end of the weak portions 56, 57. With this arrangement, the weak portions 56, 57, when torn off, are prevented from interfering with each other at edges thereof, thereby ensuring that the weak portions 56, 57 are more properly torn off.

As described above, when an excessive collision load is exerted on the first bracket 50 from the vehicle body 11, at least one of the weak portions (one of the two weak portions

56, 57) provided in the first bracket 50 causes each of the weak portions 56, 57 to be torn off, thereby allowing the occupant protection device control unit 30 in the casing 20 to be protected from the collision load.

Figure 6A:
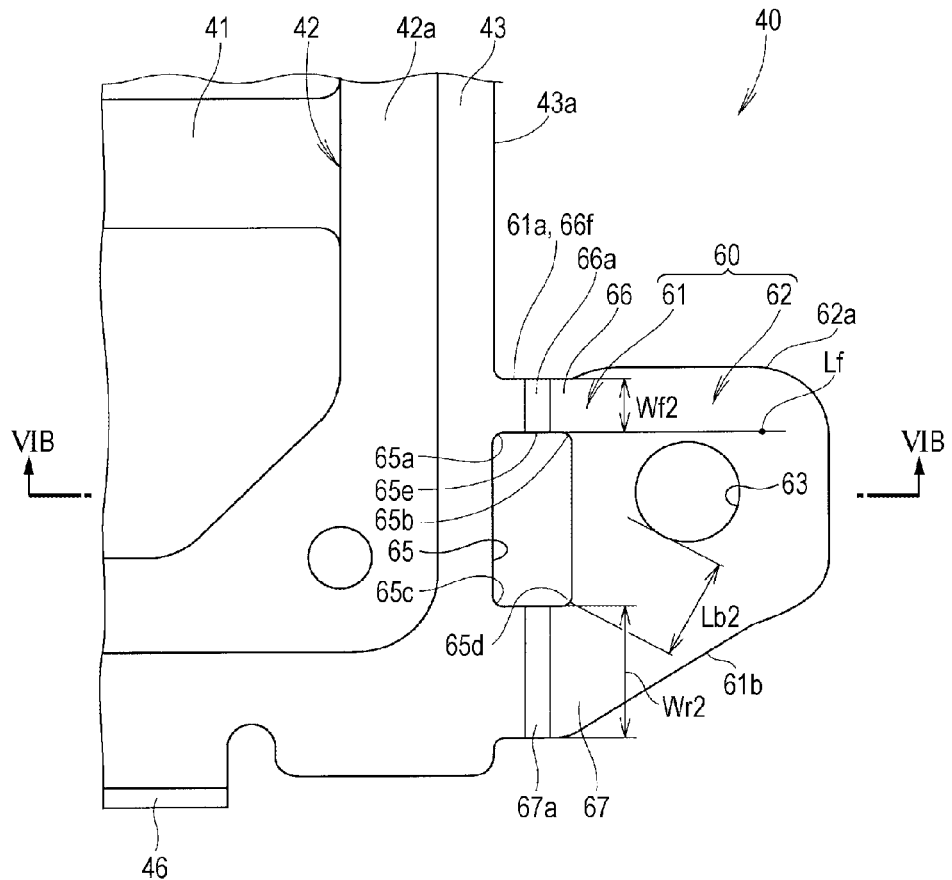
FIGS. 6A and 6B are enlarged views of a second bracket shown in FIG. 4.
Figure 6B:
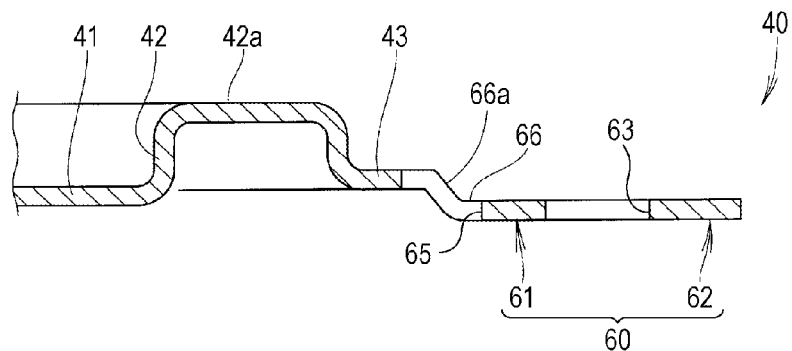

FIG. 6A is an enlarged view of a second bracket 60 shown in FIG. 4. FIG. 6B is a sectional view taken along line VIB-VIB of FIG. 6A. The second bracket 60 is composed of a plate-like leg 61 extending laterally from the edge 43a (side end surface 43a in the edge section 43) in the base 40 and a fastening member 62 that is integrally formed at an end of the leg 61 and is bolted to the vehicle body 11 (see FIG. 1).

A front end surface 61a (surface 61a facing a vehicle front) in the leg 61 is perpendicular to the side end surface 43a in the edge section 43 and is formed to linearly extend right sideways from the side end surface 43a. A rear end surface 61b in the leg 61 is formed to extend obliquely forward in relation to the side end surface 43a in the edge section 43.

A front end surface 62a in the fastening member 62 is arranged to be substantially flush with the front end surface 61a in the leg 61. The fastening member 62 has a circular bolt hole 63 formed therein, which vertically passes therethrough.

The leg 61 is composed of a through-hole 65 vertically passing therethrough, and front and rear branching portions 66, 67 separated by the through-hole 65. The through-hole 65 is located on the side end surface 43a of the edge section 43 and is formed into a rectangular shape that is elongated to extend in the longitudinal direction and is parallel to the widthwise center line CL (see FIG. 4). Four corners 65a-65d of the through-hole 65, namely, an inner front corner 65a, an outer front corner 65b, a inner rear corner 65c, and a outer rear corner 65d are formed into a square (including a substantial square), in plan view.

The two branching portions 66, 67 longitudinally separated from each other by the through-hole 65 in the leg 61 extend sideways from the edge 43a in the base 40, thereby constituting two weak portions 66, 67. The two branching portions 66, 67 are hereinafter referred to as "two weak portions 66, 67". The front branching portion 66 constitutes the front weak portion 66, while the rear branching portion 67 constitutes the rear weak portion 67.

The front weak portion 66 (one weak portion 66) of the two weak portions 66, 67 is weaker than the rear weak portion 67 (the other weak portion 67).

More specifically, the width Wf2 of the front weak portion 66 or length Wf2 from the front end surface 61a of the leg 61 (a front end surface 66f of the front weak portion 66) to a front edge 65e of the through-hole 65 is smaller than the width Wr2 of the rear weak portion 67.

A front end of the bolt hole 63 is located close to extension line Lf extending through the front edge 65e of the through-hole 65. Distance Lb2 from the outer rear corner 65d of the four corners 65a-65d in the through-hole 65 to an edge of the bolt hole 63 is configured to be large. With this arrangement, when the leg 61 receives a collision load and deforms vertically or longitudinally, the rear weak portion 67 has a greater amount of deformation in response to the load, or the rear weak portion 67 has a smaller spring rate. In other words, the magnitude of the load relative to the deformation amount of the rear weak portion 67 can be reduced.

As described above, when the base 40 is subjected to a vertical or longitudinal load, the front weak portion 66 is weaker than the rear weak portion 67. When the leg 61 is deformed, this arrangement allows the front weak portion 66 to be torn off first, thereby allowing the entire deformation force on the leg 61 to be reduced. In other words, the first weak portion 66 can be torn off as the first step of the deformation of the leg 61.

The rear end surface 61b of the leg 61 is configured to be slanted to the square outer rear corner 65d of the four corners 65a-65d in the through-hole 65. This arrangement helps cause the notch effect to act on the square outer rear corner 65d or a corner 65d.

The two weak portions 66, 67 are fabricated in a vertically-arranged step-like form in the leg 61. In other words, the weak portions 66, 67 have slopes 66a, 67a formed therein, respectively, which descend from a base end closer to the edge 43a of the base 40 to a distal end thereof. The weak portions 66, 67 have the distal end located lower than the base end (at the edge 43a of the base 40). The fastening member 62 is leveled with the end of the weak portions 66, 67. With this arrangement, the weak portions 66, 67, when torn off, are prevented from interfering with each other at edges thereof, thereby ensuring that the weak portions 66, 67 are more properly torn off.

As described above, when an excessive collision load is exerted on the second bracket 60 from the vehicle body 11, at least one of the weak portions (one of the two weak portions 66, 67) provided in the second bracket 60 causes each of the weak portions 66, 67 to be torn off, thereby allowing the occupant protection device control unit 30 in the casing 20 to be protected from the collision load.

Figure 7A:
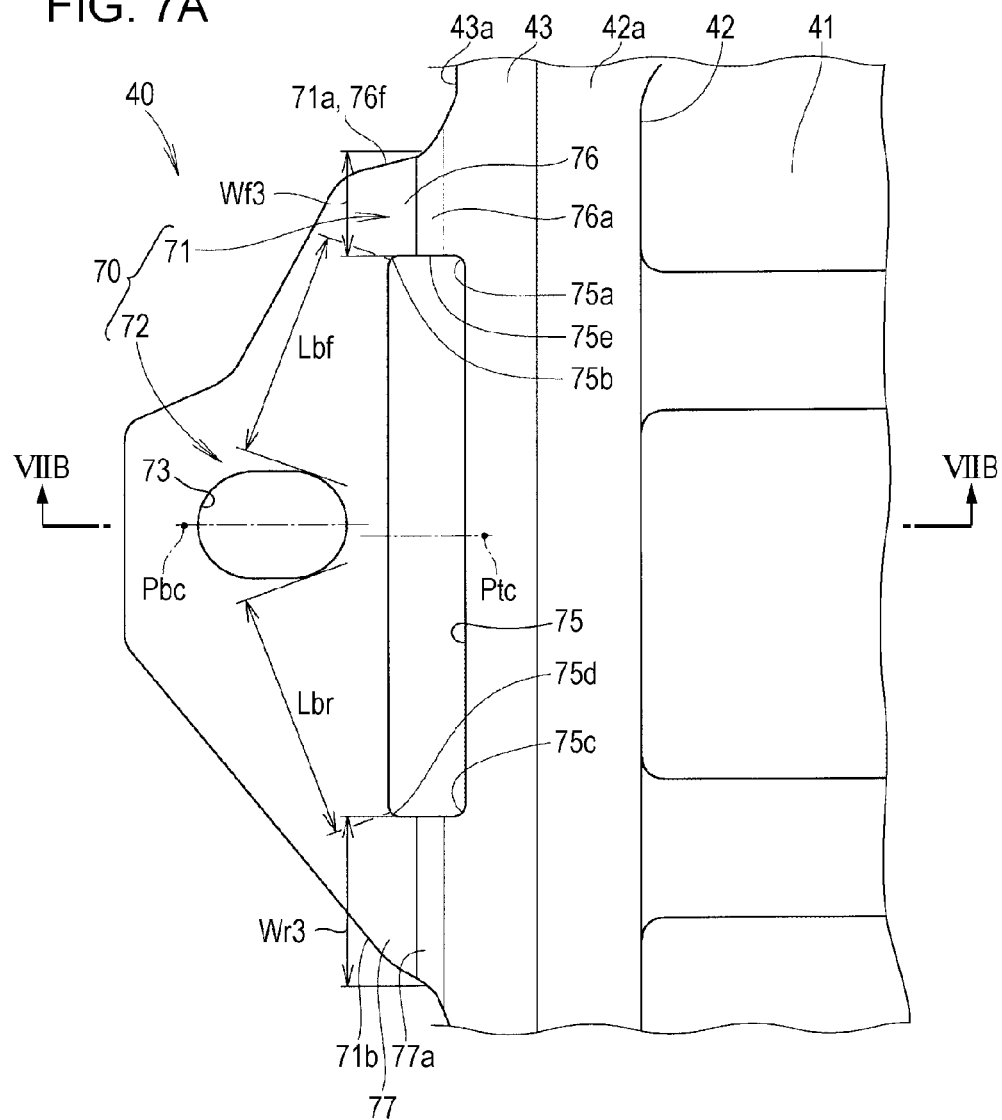
FIGS. 7A and 7B are enlarged views of a third bracket shown in FIG. 4.
Figure 7B:
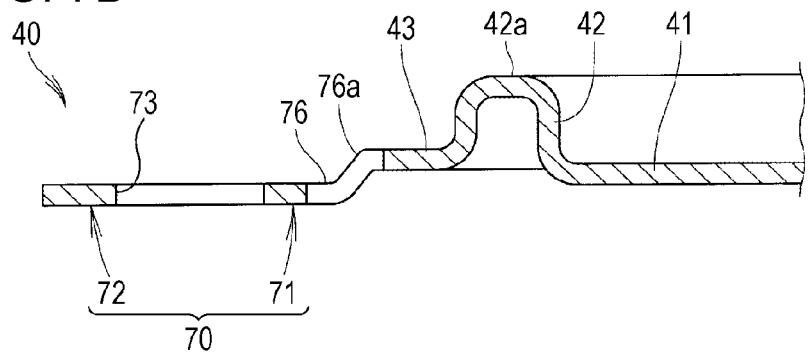

FIG. 7A is an enlarged view of a third bracket 70 shown in FIG. 4. FIG. 7B is a sectional view taken along line VIIB-VIIB of FIG. 7A. The third bracket 70 has a substantially tapered shape in plan view, which is tapered in the lateral direction from the edge 43a of the base 40 (the side end surface 43a of the edge section 43). The third bracket 70 is composed of a plate-like leg 71 extending laterally from the side end surface 43a in the edge section 43 and a fastening member 72 that is integrally formed at an end of the leg 71 and is bolted to the vehicle body 11 (see FIG. 1).

The leg 71 has a substantially tapered shape in plan view, which is tapered in the lateral direction from the edge 43a of the base 40. A front end surface 71a (surface 71a facing a vehicle front) in the leg 71 is formed to extend obliquely rearward in relation to the side end surface 43a in the edge section 43. A rear end surface 71b in the leg 71 is formed to extend obliquely forward in relation to the side end surface 43a in the edge section 43.

The leg 71 is composed of a through-hole 75 vertically passing therethrough, and front and rear branching portions 76, 77 separated by the through-hole 75. The through-hole 75 is located on the side end surface 43a of the edge section 43 and is formed into a rectangular shape that is elongated to extend in the longitudinal direction and is parallel to the widthwise center line CL (see FIG. 4). Four corners 75a-75d of the through-hole 75, namely, an inner front corner 75a, an outer front corner 75b, a inner rear corner 75c, and a outer rear corner 75d are formed into a square (including a substantial square) in plan view.

The two branching portions 76, 77 longitudinally separated from each other by the through-hole 75 in the leg 71 extend sideways from the edge 43a in the base 40, thereby constituting two weak portions 76, 77. The two branching portions 76, 77 are hereinafter referred to as "two weak portions 76, 77". The front branching portion 76 constitutes the front weak portion 76, while the rear branching portion 77 constitutes the rear weak portion 77.

The front weak portion 76 (one weak portion 76) of the two weak portions 76, 77 is weaker than the rear weak portion 77 (the other weak portion 77).

More specifically, the width Wf3 of the front weak portion 76 or length Wf3 from the front end surface 71a of the leg 71 (a front end surface 76f of the front weak portion 76) to a front edge 75e of the through-hole 75 is smaller than the width Wr3 of the rear weak portion 77. The fastening member 72 has an oblong hole-like bolt hole 73 vertically passing therethrough, which is formed along the width direction of the base. The center Pbc of the bolt hole 73 is located close to the longitudinal center Ptc of the through-hole 75.

Distance Lbr from the outer rear corner 75d of the four corners 75a-75d in the through-hole 75 to an edge of the bolt hole 73 is configured to be larger than distance from the outer front corner 75b to an edge of the bolt hole 73. With this arrangement, when the leg 71 receives a collision load and deforms vertically or longitudinally, the rear weak portion 77 has a greater amount of deformation in response to the load, or the rear weak portion 77 has a smaller spring rate. In other words, the magnitude of the load relative to the deformation amount of the rear weak portion 77 can be reduced.

As described above, when the base 40 is subjected to a vertical or longitudinal load, the front weak portion 76 is weaker than the rear weak portion 77. When the leg 71 is deformed, this arrangement allows the front weak portion 76 to be torn off first, thereby allowing the entire deformation force on the leg 71 to be reduced. In other words, the first weak portion 76 can be torn off as the first step of the deformation of the leg 71.

The rear end surface 71b of the leg 71 is configured to be slanted to the square outer rear corner 75d of the four corners 75a-75d in the through-hole 75. This arrangement helps cause the notch effect to act on the square outer rear corner 75d or a corner 75d.

The two weak portions 76, 77 are fabricated in a vertically-arranged step-like form in the leg 71. In other words, the weak portions 76, 77 have slopes 76a, 77a formed therein, respectively, which descend from a base end closer to the edge 43a of the base 40 to a distal end thereof. The weak portions 76, 77 have the distal end located lower than the base end (at the edge 43a of the base 40). The fastening member 72 is leveled with the end of the weak portions 76, 77. With this arrangement, the weak portions 76, 77, when torn off, are prevented from interfering with each other at edges thereof, thereby ensuring that the weak portions 76, 77 are more properly torn off.

As described above, when an excessive collision load is exerted on the third bracket 70 from the vehicle body 11, at least one of the weak portions (one of the two weak portions 76, 77) provided in the third bracket 70 causes each of the weak portions 76, 77 to be torn off, thereby allowing the occupant protection device control unit 30 in the casing 20 to be protected from the collision load.

As shown in FIG. 4, the distances between the widthwise center line CL and the centers of the bolt holes 53, 63, 73 are equal to one another. Also, the distances between the widthwise center line CL and the through-holes 55, 65, 75 are equal to one another. Furthermore, the widths of the through-holes 55, 65, 75 are equal to one another.

The weak portions 56, 76 of the first and third brackets 50, 70 are located a basically (substantially) equal distance away from and behind a front end surface or the front wall 45 in the base 40. In addition, the rear weak portion 57 of the first bracket 50, the rear weak portion 77 of the third bracket 70, the front weak portion 66 of the second bracket 60, and the rear weak portion 67 of the second bracket 60 are arranged in that order behind the front weak portion 56 of the first bracket 50. In particular, when the base 40 is subjected to a load, the front weak portions 56, 66, 76 are preferably configured to have fracture strength in such a manner that they are torn off in the order of the front weak portion 56 of the first bracket 50, the front weak portion 66 of the second bracket 60, and the front weak portion 76 of the third bracket 70.

As shown in FIG. 2, the main body 90 of the casing 20 is made of a resin molding, such as a hard resin molding. The main body 90 is formed in a substantially rectangular shape in plan view, which is large enough to cover the entire part of the center section 41 and the frame section 42 from above, and has its entire bottom surface opened. The main body 90 is overlaid on the upper end surface 42a of the frame section 42 with the substrate 31 therebetween and secured to the frame section 42 from below together with the substrate 31 with screws 91.

In other words, the casing 20 is composed of the main body 90 having its bottom opened and the base 40 that covers the bottom surface of the main body 90. The substrate 31 is secured to the main body 90 with the screws 91, together with the base 40 located therebelow.

The main body 90 has a skirt 92 formed integrally therewith at its bottom edge, which extends downward along its entire circumference. The skirt 92 covers the entire outer circumference of the frame section 42. With this arrangement, the main body 90, even when exposed to water from above, prevents water from entering the upper end surface 42a of the frame section 42. The substrate 31 is housed inside the casing 20 to be protected from exposure to water from the outside. In addition, each of the front groove 47 and rear groove 48 has the skirt 92 put thereinto from above.

Next, the effect of the above configuration is described below. FIG. 8A is a view, when seen from a right side, showing a state where the floor panel of the vehicle body comes into contact with the casing 20 from lower front of a vehicle. FIG. 8B is a view, when seen from a left side, showing the state shown in FIG. 8A.

The brackets 50-70 are bolted to the vehicle body 11. If part of a front section of the vehicle body 11 or, for example, a portion in the floor panel which is just in front of the casing 20 is subjected to a rearward and upward plastic deformation resulting from an excessive collision load "fu" (upward and rearward load fu) from lower front of a vehicle, such a portion comes into contact with the front wall 45 in the base 40. As a result, the portion is deformed, pressing the front wall 45 of the base 40 in the rear upward direction. In particular, the front weak portions 56, 76 in the first and third brackets 50, 70, which are located in the front half of the base 40, are subjected to an upward plastic deformation caused by the upward and rearward excessive load fu.

As such a plastic deformation is becoming larger, the front weak portion 56 of the first bracket 50 which is located in the front of the base 40 is torn off first during the time when the load fu is relatively small. After that, the rear weak portion 57 of the first bracket 50 and the weak portions 66, 67, 76, 77 of the second and third brackets 60, 70 continue upward plastic deformation and finally begin to break in sequence at different timings to break. In the second and third brackets 60, 70, the front weak portions 66, 76 also break earlier than the rear weak portions 67, 77, thereby protecting the occupant protection device control unit 30 (see FIG. 2) in the casing 20 from the collision load fu.

Figure 9:
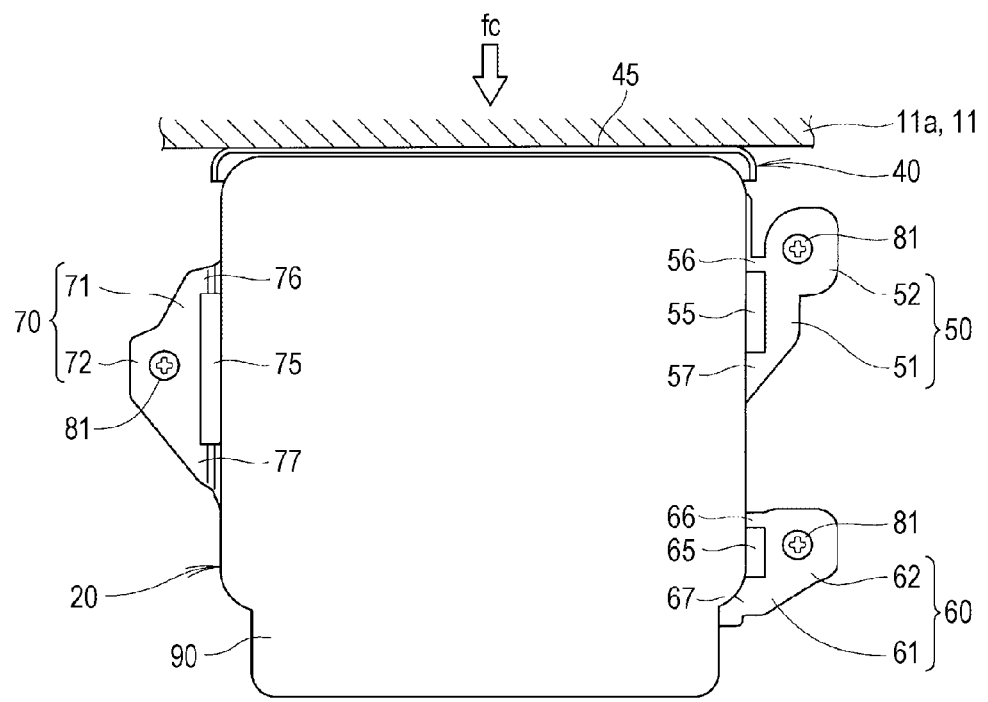
FIG. 9 is an explanatory drawing illustrating a state where part of a vehicle body comes into contact with a casing shown in FIG. 2 from a vehicle front.

On the other hand, if a portion 11a of a front section of the vehicle body 11 or, for example, a portion 11a in the floor panel which is just in front of the casing 20 is subjected to a rearward plastic deformation resulting from an excessive collision load fc (rearward load fc) from a vehicle front, such a portion 11a comes into contact with the entire surface of the front wall 45 in the base 40, as shown in FIG. 9. As a result, the portion 11a is deformed, pressing the front wall 45 of the base 40 in the rearward direction. This causes all of the weak portions 56, 57, 66, 67, 76, 77 to be displaced in the rearward direction in relation to the fastening members 52, 62, 72 bolted to the vehicle body 11.

Figure 10:
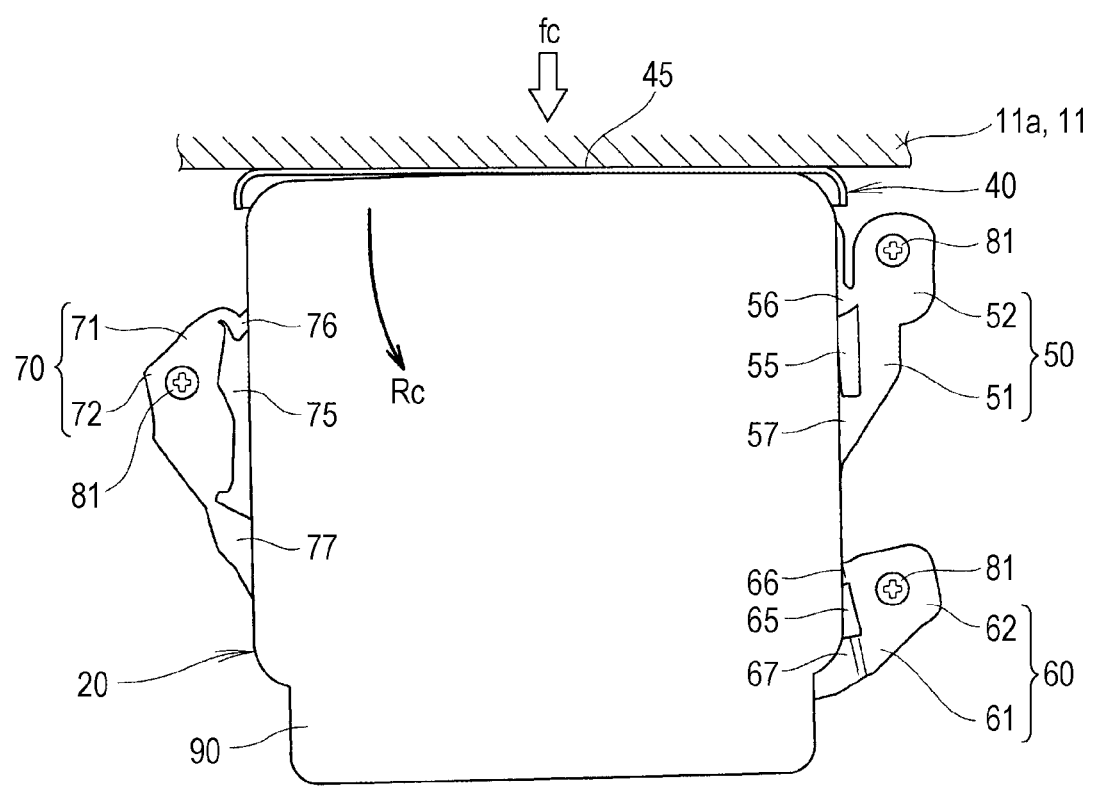
FIG. 10 is an explanatory drawing, as viewed from above, illustrating a state where a casing shown in FIG. 9 begins to rotate counterclockwise when further pressed from the vehicle front.
Figure 11:
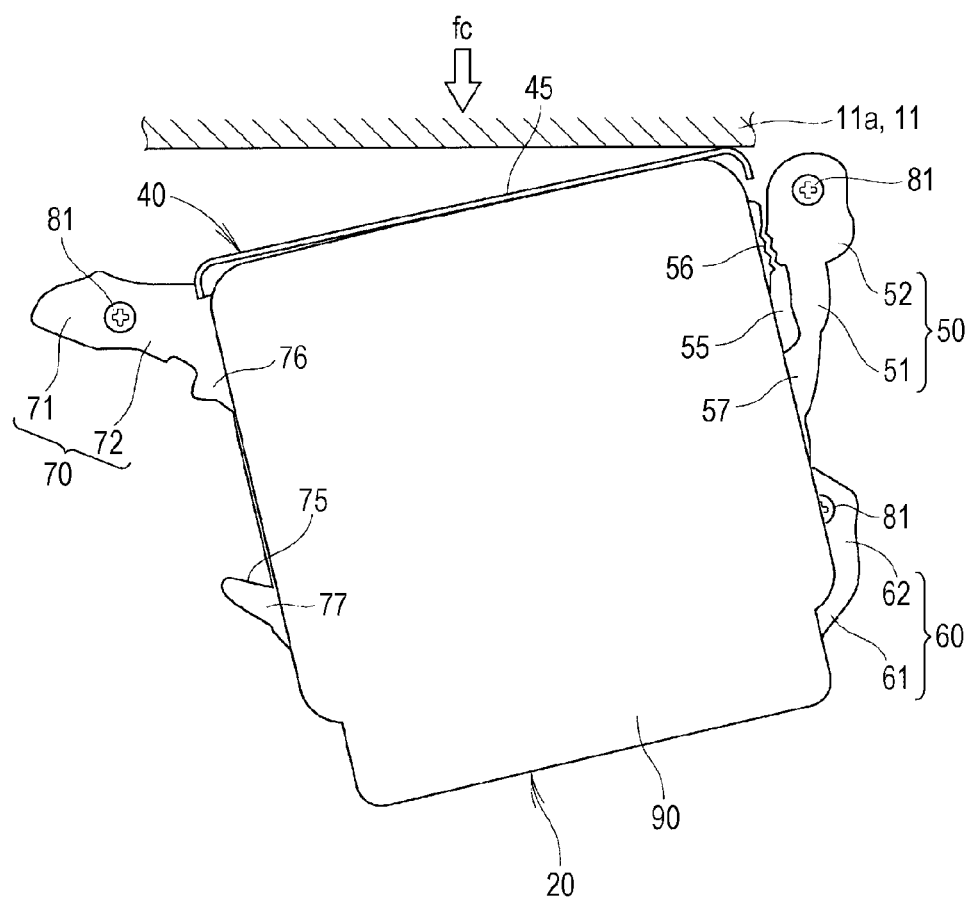
FIG. 11 is an explanatory drawing, as viewed from above, illustrating a state where a weak portion in the front of a first bracket torn off when a casing shown in FIG. 10 is further pressed from the vehicle front.

Only one of the brackets (bracket 70) is provided on the left side of the base 40, whereas the two brackets 50, 60 are longitudinally provided on the right side of the base 40. This causes the front weak portion 76 of the third bracket 70 to be deformed in the rearward direction to a greater degree than the other weak portions 56, 57, 66, 77. Accordingly, as shown in FIG. 10, the casing 20 begins to pivot counterclockwise (in the direction indicated by arrow Rc) about a supporting point of a right end of the front wall 45 in the base 40. Consequently, an excessive breaking force is exerted on the front weak portion 56 of the first bracket 50 in the counterclockwise direction, tearing off the front weak portion 56, as shown in FIG. 11. The other weak portions 57, 66, 67, 76, 77 are also subjected to a plastic deformation and some of them are torn off at different timings or simultaneously before or after the front weak portion 56 is torn off, thereby allowing the occupant protection device control unit 30 (see FIG. 2) in the casing 20 to be protected from the collision load fc.

Above descriptions are summarized as follows. If an excessive collision load fc is exerted on the first bracket 50 from the vehicle body, the collision load fc is dispersed in the fastening member 52 to the two weak portions 56, 57 in the leg 51, as shown in FIG. 9. The weak portions 56, 57 may be configured with regard to breaking strength to allow them to break when subjected to the dispersed, smaller levels of load. The weak portions 56, 57 can be torn off separately by relatively smaller levels of load. The first bracket 50 is torn off quickly and reliably in response to the excessive collision load fc. In other words, the first bracket 50 can be controlled so as to avoid continued plastic deformation without tearing off.

This enhances the performance for protecting the occupant protection device control unit 30 (see FIG. 2) in the casing 20 from the collision load fc. The occupant protection device control unit 30 has various important data stored therein. Such enhanced protection of the occupant protection device control unit 30 ensures that the various data are read out from the occupant protection device control unit 30. In addition, the two weak portions 56, 57 are composed of only the branching portions 56, 57 separated by the through-hole 55 in the leg 51 of the first bracket 50, resulting in a reduction in manufacturing cost of the casing 20.

Furthermore, one of the two weak portions 56, 57 is weaker than the other. With this arrangement, the two weak portions 56, 57 are torn off at different timings, thereby allowing the first bracket 50 to be torn off more quickly and reliably in response to an excessive collision load.

The second bracket 60 and the third bracket 70 work in the same manner as the first bracket 50.

The casing 20 according to the present disclosure is suitable for use in the casing for housing the occupant protection device control unit 30 provided with an acceleration sensor. Although a specific form of embodiment has been described above and illustrated in the accompanying drawings in order to be more clearly understood, the above description is made by way of example and not as limiting the scope of the invention defined by the accompanying claims. The scope of the invention is to be determined by the accompanying claims. Various modifications apparent to one of ordinary skill in the art could be made without departing from the scope of the invention. The accompanying claims cover such modifications.

We claim:

1. A casing mounting structure for an occupant protection device control unit comprising:
   a casing for housing the occupant protection device control unit; and
   a bracket provided to the casing for mounting the casing on a vehicle body, the bracket including a weak portion to be broken to protect the occupant protection device control unit housed in the casing if an excessive collision load is exerted on the bracket from the vehicle body,
   wherein the casing includes a base made of a metallic plate with an upper surface facing upward and a lower surface facing downward, and a main body mounted on the upper surface of the base,
   wherein the bracket is provided to the base,
   wherein the bracket includes a plate-shape leg portion extending laterally from an edge of the base and a fastening portion disposed at an end of the leg portion and integrally formed with the leg portion, the fastening portion being bolted to the vehicle body;
   wherein the leg portion includes a through-hole passing through the leg portion in thickness direction of the plate-shape leg portion to have two branching portions separated by the through-hole therebetween, each of the two branching portions including a step-shape portion stepped in an extending direction of the leg portion, and
   wherein the weak portion includes a first weak portion and a second weak portion, one of the two branching portions constituting the first weak portion and the other of the two branching portions constituting the second weak portion.

2. The casing mounting structure for an occupant protection device control unit according to claim 1, wherein one of the first and second weak portions is weaker than the other.

3. The casing mounting structure for an occupant protection device control unit according to claim 1, wherein the step-shape portion has a step-down shape.

4. The casing mounting structure for an occupant protection device control unit according to claim 1, wherein the leg portion includes a rear edge extending obliquely and laterally toward a front from the edge of the base.

5. The casing mounting structure for an occupant protection device control unit according to claim 1, wherein the bracket includes a first bracket disposed on one side of the base and second and third brackets disposed on the other side of the base such that the first bracket is broken prior to the second and third brackets.

6. The casing mounting structure for an occupant protection device control unit according to claim 5, wherein the first bracket includes the rear weak portion positioned at a rear of the second bracket and at a front of the third bracket.

7. The casing mounting structure for an occupant protection device control unit according to claim 5, wherein the bracket includes a recess portion recessed from a front to a rear of the bracket,
   wherein the recess portion is delimited by a side edge of the base, a front edge of the leg portion and an inner edge of the fastening portion.

* * * * *